US012641741B2

(12) United States Patent
Wang et al.

(10) Patent No.: US 12,641,741 B2
(45) Date of Patent: May 26, 2026

(54) DISPLAY DEVICE

(71) Applicant: BOE Technology Group Co., Ltd.,
Beijing (CN)

(72) Inventors: Zifeng Wang, Beijing (CN); Sijia Guo,
Beijing (CN); Yushun Jie, Beijing
(CN); Shuo Chen, Beijing (CN);
Jinghua Yang, Beijing (CN); **Yunpeng
Wu, Beijing (CN); Wenbin Wang**,
Beijing (CN); Guangsheng Ma, Beijing
(CN); Junmin Sun, Beijing (CN);
Zhaowei Li, Beijing (CN)

(73) Assignee: **BOE TECHNOLOGY GROUP CO.,
LTD.**, Beijing (CN)

( * ) Notice: Subject to any disclaimer, the term of this
patent is extended or adjusted under 35
U.S.C. 154(b) by 200 days.

(21) Appl. No.: 18/692,346

(22) PCT Filed: Aug. 24, 2022

(86) PCT No.: PCT/CN2022/114381
§ 371 (c)(1),
(2) Date: Mar. 15, 2024

(87) PCT Pub. No.: WO2023/040608
PCT Pub. Date: Mar. 23, 2023

(65) Prior Publication Data
US 2024/0357752 A1 Oct. 24, 2024

(30) Foreign Application Priority Data
Sep. 16, 2021 (CN) .......................... 202111086902.8

(51) Int. Cl.
*H05K 5/30* (2025.01)
*H05K 5/02* (2006.01)

(52) U.S. Cl.
CPC ............. *H05K 5/30* (2025.01); *H05K 5/0217*
(2013.01)

(58) Field of Classification Search
CPC .............................. H05K 5/30; H05K 5/0217
See application file for complete search history.

(56) References Cited

U.S. PATENT DOCUMENTS

2006/0290835 A1* 12/2006 Sakuma ............ G02F 1/133308
348/794
2011/0057215 A1* 3/2011 Chen ........................ G09F 7/002
257/E33.056

(Continued)

FOREIGN PATENT DOCUMENTS

CN 201134090 Y 10/2008
CN 202281993 U 6/2012

(Continued)

OTHER PUBLICATIONS

International Search Report from PCT/CN2022/114381 dated Oct.
25, 2022.

(Continued)

*Primary Examiner* — Sunghyoun Park
(74) *Attorney, Agent, or Firm* — Calfee, Halter &
Griswold LLP

(57) ABSTRACT

A display device, comprising frame assembly (EE) that
comprises a plurality of first frames (E1) located above and
on two sides of the display module (MDL), the first frame
(E1) comprises a first inner side wall (E11), a first outer side
wall (E12) and a connecting side wall, and the connecting
side wall comprising a first connecting side wall (E131) and
a second connecting side wall (E132), which is located on
the front side of the first connecting side wall (E131); the
first connecting side wall (E131), the second connecting side
wall (E132), the first inner side wall (E11) and the first outer
side wall (E12) form a first cavity (E1A); and the first inner (Continued)

side wall (E11) is connected to the display module (MDL) by means of a screw (DD1), which has an end cap located in the first cavity (E1A).

20 Claims, 7 Drawing Sheets

(56) References Cited

U.S. PATENT DOCUMENTS

| | | | | |
|---|---|---|---|---|
| 2016/0091747 | A1 | 3/2016 | Koyama | |
| 2021/0202449 | A1* | 7/2021 | Shin .................... | H01L 25/0753 |

FOREIGN PATENT DOCUMENTS

| | | | |
|---|---|---|---|
| CN | 103476213 | A | 9/2013 |
| CN | 204719702 | U | 10/2015 |
| CN | 205210471 | U | 5/2016 |
| CN | 107342021 | A | 11/2017 |
| CN | 208024210 | U | 10/2018 |
| CN | 109817108 | A | 5/2019 |
| CN | 110030244 | A | 7/2019 |
| CN | 209133120 | U | 7/2019 |
| CN | 210136491 | U | 3/2020 |
| CN | 210142483 | U | 3/2020 |
| CN | 210325012 | U | 4/2020 |
| CN | 210896389 | U | 6/2020 |
| CN | 212515285 | U | 2/2021 |
| CN | 11322418 | A | 3/2021 |
| CN | 21324122 | U | 5/2021 |
| CN | 213241122 | U | 5/2021 |
| CN | 113223418 | A | 8/2021 |
| CN | 216412571 | U | 4/2022 |

OTHER PUBLICATIONS

Written Opinion from PCT/CN2022/114381 dated Oct. 25, 2022.
First Office Action of CN application No. 202111086902.8 dated Dec. 25, 2025.

* cited by examiner

DISPLAY DEVICE

CROSS REFERENCE

The present application is a national phase application of International Application No. PCT/CN2022/114381, filed on Aug. 24, 2022, which claims priority from Chinese patent application No. 202111086902.8, entitled "DISPLAY DEVICE" and filed on Sep. 16, 2021, and the entire contents thereof are incorporated herein by reference.

TECHNICAL FIELD

The present disclosure relates to the field of display technology, and in particular, to a display device.

BACKGROUND

The assembly process of large-sized display devices requires a large amount of assembly work. In order to reduce the difficulty of assembly, large-size display devices often have obvious splicing traces, such as exposed screw holes, etc.

It should be noted that, information disclosed in the above background portion is provided only for better understanding of the background of the present disclosure, and thus it may contain information that does not form the prior art known by those ordinary skilled in the art.

SUMMARY

The present disclosure provides a display device.

According to an aspect of the present disclosure, a display device is provided, including a display module and a frame assembly surrounding the display module; wherein the frame assembly includes a plurality of first frames disposed on an upper side and both the lateral sides of the display module and a second frame disposed on a lower side of the display module;

the first frame includes a first inner side wall, a first outer side wall and a connecting side wall, the first outer side wall is away from the display module relative to the first inner side wall, the connecting side wall is disposed between the first inner side wall and the first outer side wall and includes a first connecting side wall and a second connecting side wall disposed in front of the first connecting side wall, and wherein a first cavity is formed by the first connecting side wall, the second connecting side wall, the first inner side wall and the first outer side wall; and the first inner side wall and the display module are connected by a screw with an end cap located in the first cavity.

According to an implementation of the present disclosure, the first inner side wall and the first outer side wall are respectively formed with an inner screw mounting hole and an outer screw mounting hole aligned with each other; the screw is connected to the display module through the inner screw mounting hole, and the outer screw mounting hole is configured to facilitate using of installation tools when tightening the screw.

According to an implementation of the present disclosure, the inner screw mounting hole is extended along an extending direction of the first frame and includes a penetration hole at one end and a long hole connected to the penetration hole; the penetration hole is configured to allow the end cap of the screw to pass through; and the long hole is configured to allow a screw rod of the screw to pass through but does not allow the end cap of the screw to pass through.

According to an implementation of the present disclosure, the frame assembly includes a top frame disposed on the upper side of the display module and a side frame disposed on each lateral side of the frame assembly;

the side frame includes one or more first frames, and the penetration hole in the first frame is located below the long hole; and the top frame includes one or more first frames, and in each inner screw mounting hole in the first frame, the penetration hole is located on a same side of the long hole.

According to an implementation of the present disclosure, the first frame further includes a frame cover, the frame cover is detachably connected to the first outer side wall and is covered on the outer screw mounting hole.

According to an implementation of the present disclosure, when a plurality of first frames are spliced sequentially along a straight line, the frame covers of the plurality of first frames spliced sequentially along the straight line have an integrated structure.

According to an implementation of the present disclosure, a slide groove extending along an extending direction of the first frame is disposed on an outer surface of the first outer side wall, and the frame cover includes a slide bar that is in sliding fit with the slide groove.

According to an implementation of the present disclosure, the first inner side wall and the first outer side wall are extended beyond the display module in a front direction;

the connecting side wall further includes a third connecting side wall, and the third connecting side wall is connected to a front end of the first outer side wall; and a first infrared cavity for accommodating an infrared touch component is encircled by the first inner side wall, the first outer side wall, the second connecting side wall and the third connecting side wall; and a first light-transmitting slit communicating with the first infrared cavity is formed between the first inner side wall and the third connecting side wall, and the first light-transmitting slit is disposed in front of the display module.

According to an implementation of the present disclosure, the frame assembly includes a top frame disposed on the upper side of the display module and a side frame disposed on each lateral side of the frame assembly; the side frame includes one first frame or a plurality of first frames that are spliced in sequence; the top frame includes a plurality of first frames that are spliced in sequence; a pin hole is provided at each end of the first frame, and two adjacent first frames spliced along a straight line are connected through a pin inserted into the pin hole.

According to an implementation of the present disclosure, the pin includes a threaded section and a pin rod section; and the pin hole at one end of the first frame is a first pin hole that is able to be in screw thread fit with the threaded section, and the pin hole at other end of the first frame is a second pin hole that is able to be in interference fit with the pin rod section.

According to an implementation of the present disclosure, a protruding portion is disposed in the first cavity, and the pin hole is formed in the protruding portion; the protruding portion further includes an opening slit communicating with the pin hole and extended along an extension direction of the first frame.

According to an implementation of the present disclosure, in the side frame, the pin hole at a lower end of the first frame is the first pin hole, and the pin hole at an upper end of the first frame is the second pin hole; and in the top frame, the first pin hole of each first frame is located at a same end of the first frame.

According to an implementation of the present disclosure, the second frame includes a second cavity and a detachable front cover, and a system control component for driving the display module is disposed in the second cavity.

According to an implementation of the present disclosure, the second frame includes a second inner side wall, a second outer side wall and a rear side wall; the second outer side wall is away from the display module relative to the second inner side wall; the rear side wall is connected with a rear side end of the second inner wall and a rear side end of the second outer wall; and a second cavity is encircled by the second inner wall, the second outer wall, the rear side wall and the front cover; and the second inner side wall and the display module are connected by a screw with an end cap located in the second cavity.

According to an implementation of the present disclosure, in the second cavity, a mounting rib is disposed on the rear side wall; and the system control component is installed on the mounting rib.

According to an implementation of the present disclosure, the second inner wall is extended beyond the display module in a front direction; the second frame further includes a first vertical wall, a second vertical wall and a horizontal wall; the first vertical wall is connected to a lower side of the second inner wall; the horizontal wall is connected to a lower end of the first vertical wall and a lower end of the second vertical wall;

a second infrared cavity for accommodating an infrared touch component is encircled by the first vertical wall, the second vertical wall, the horizontal wall and the second inner wall; and a second light-transmitting slit communicating with the second infrared cavity is formed between the second inner wall and the second vertical wall, and the second light-transmitting slit is disposed in front of the display module.

According to an implementation of the present disclosure, the horizontal wall includes an inserting plate extending downward; and an upper end of the front cover includes a slot that matches the inserting plate; and a lower end of the front cover is detachably connected to the second outer side wall.

According to an implementation of the present disclosure, the front cover includes a cover portion and a connecting portion, an upper end of the cover portion includes the slot; a lower end of the cover portion is connected to an upper end of the connecting portion by a screw; and a lower end of the connecting portion is bent below the second outer side wall and connected to the second outer side wall by a screw.

According to an implementation of the present disclosure, the frame assembly further includes a corner piece disposed at four top corners; and the corner piece is connected to the first frame or the second frame.

According to an implementation of the present disclosure, the corner piece includes a lower corner piece disposed at a lower top corner and an upper corner piece disposed at an upper top corner; the frame assembly includes a top frame disposed at the upper side of the display module, a bottom frame disposed at the lower side of the display module and a side frame disposed at each lateral side of the display module;

the lower corner piece and the bottom frame are connected by a screw; the side frames are connected with the upper corner piece and the lower corner piece by a pin; and the pin includes a threaded section and a pin rod section; and wherein the lower corner piece is in screw thread fit with the threaded section of the pin, a lower end of the side frame is in interference fit with the pin rod section of the pin; an upper end of the side frame is in screw thread fit with the threaded section of the pin, and the upper corner piece is connected to the pin rod section of the pin.

According to an implementation of the present disclosure, the display module includes a plurality of interconnected connection structures and a plurality of LED display panels located on each of the connection structures; and the connection structure includes a frame connection hole capable of connecting with the frame assembly by the screw.

According to an implementation of the present disclosure, the display module includes a plurality of pre-assembled display modules; each of the pre-assembled display modules includes a plurality of LED display units connected sequentially along a column direction; and each of the LED display unit includes the connection structure and the LED display panels located on the connection structure.

According to an implementation of the present disclosure, the pre-assembled display module further includes a backplane, and each of the LED display units is fixedly connected to the backplane.

According to an implementation of the present disclosure, in the LED display unit, the LED display panel is detachably fixed on a front side of the connection structure; and in the pre-assembled display module, each of the connection structures is connected sequentially along the column direction, and a rear surface of each of the connection structures is connected to the backplane.

According to an implementation of the present disclosure, the connection structure includes a chassis and a structural member fixed in the chassis; an edge of the chassis is flush with an edge of the LED display panel;

the structural member is connected to the LED display panel and the backplane; and the chassis includes a plurality of chassis bars connected end to end, and any one of the chassis bars includes the frame connection hole.

BRIEF DESCRIPTION OF THE DRAWINGS

The accompanying drawings, which are incorporated in and constitute a part of this specification, illustrate embodiments consistent with the disclosure and together with the description, serve to explain the principles of the disclosure. Obviously, the drawings in the following description are only some embodiments of the present disclosure. For those of ordinary skill in the art, other drawings can be obtained based on these drawings without exerting creative efforts.

In FIG. 2, the image in the center shows a front view of the LED display unit, and the four images around the front view respectively show side views of the LED display unit in four different directions, up, down, left, and right.

FIG. 13-1 is a schematic structural diagram of installing an upper corner piece in an embodiment of the present disclosure.

FIG. 13-2 is a schematic structural diagram of installing a lower corner piece in an embodiment of the present disclosure.

DETAILED DESCRIPTION

Figure 1:
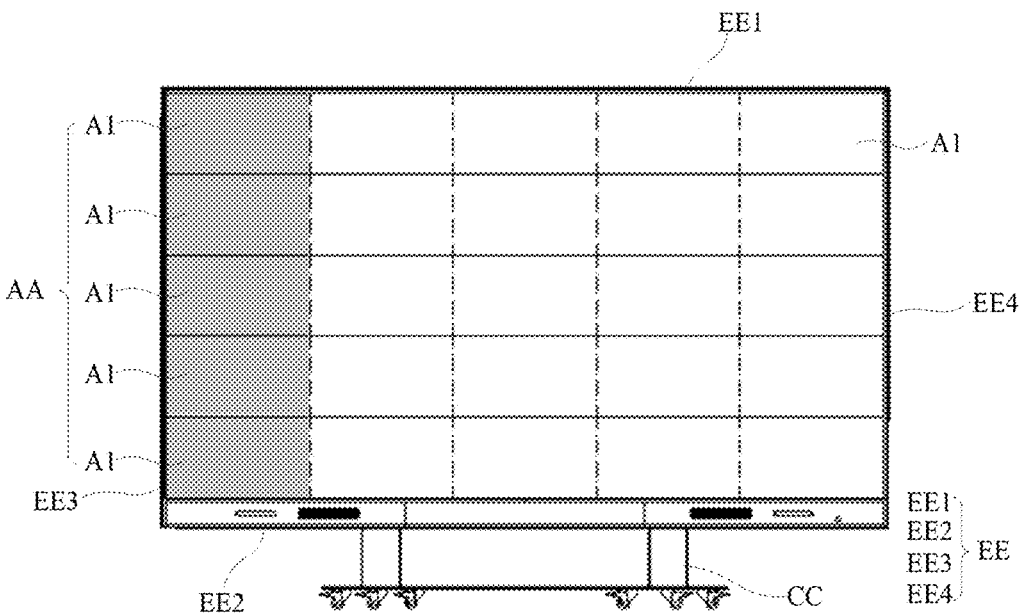
FIG. 1 is a schematic structural diagram of a display device in an embodiment of the present disclosure.

Example embodiments will now be described more fully with reference to the accompanying drawings. Example embodiments may, however, be embodied in various forms and should not be construed as limited to the embodiments set forth herein; rather, these embodiments are provided so that this disclosure will be thorough and complete and will fully convey the concepts of the example embodiments to those skilled in the art. The same reference numerals in the drawings represent the same or similar structures, and thus their detailed descriptions will be omitted. Furthermore, the drawings are merely schematic illustrations of the present disclosure and are not necessarily drawn to scale.

Although relative terms, such as "upper" and "lower" are used in this specification to describe the relative relationship of one component illustrated in the drawings to another component, these terms are used in this specification only for convenience, for example, according to the direction of the example described drawings. It will be understood that if the illustrated device were turned upside down, components described as "upper" would become "lower" components. When a structure is "on" another structure, it may mean that the structure is integrally formed on the other structure, or that the structure is "directly" placed on the other structure, or that the structure is "indirectly" placed on the other structure through another structure.

The terms "a", "an", "the", "said" and "at least one" are used to indicate the presence of one or more elements/components/etc.; the terms "include" and "have" are used to indicate an open-ended inclusive and mean that there may be additional elements/components/etc. in addition to those listed; and the terms "first", "second", "third" etc. are only used as a marker, not a limit on the number of its objects.

The present disclosure provides a display device and a splicing method thereof. See FIGS. 1 and 9. The display device includes a display module MDL and a frame component EE surrounding the display module MDL. In some embodiments, the display module MDL is a spliced display module MDL, and the spliced display module MDL may include a plurality of mutually spliced LED display units A1. In this way, the display device has a larger display size and can be applied to scenes such as stages, exhibition halls, conference venues, etc. that require large display device.

Figure 2:
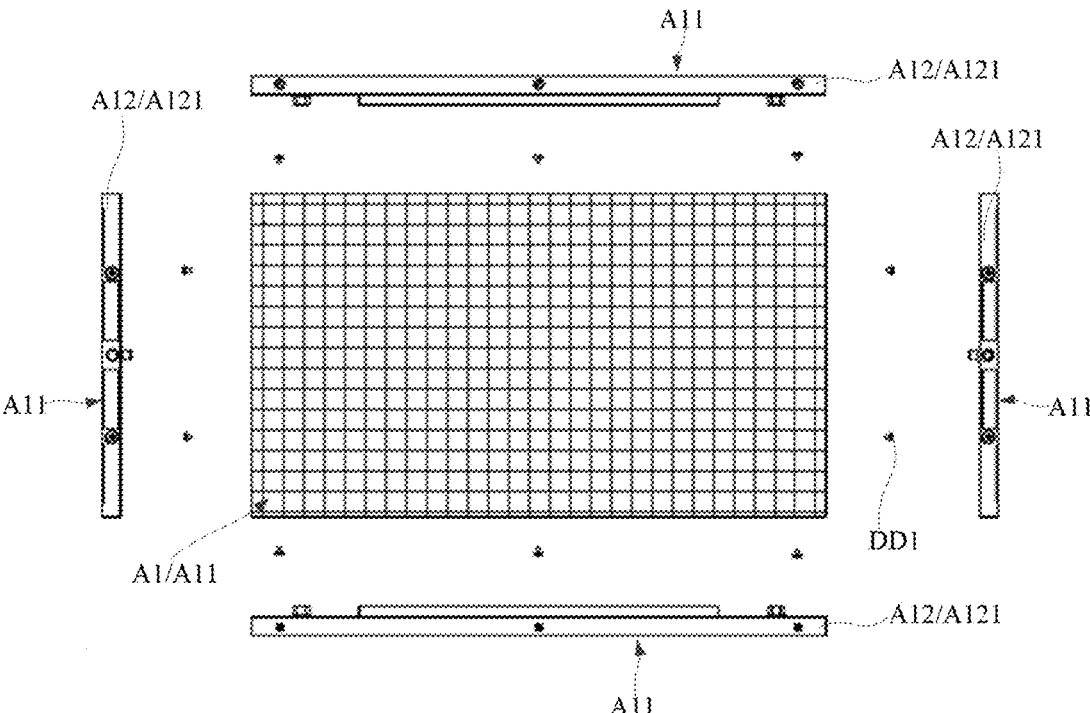
FIG. 2 is a schematic structural diagram of an LED display unit in an embodiment of the present disclosure.

FIG. 2 shows a schematic structural diagram of the LED display unit A1. In the embodiment, the schematic diagram in the middle is a front view of the LED display unit A1. In this view, only the LED display panel A11 can be seen, and the rest is completely blocked by the LED display panel A11. FIG. 2 also shows the four side views of the LED display panel A11, which are up, down, left and right, respectively, and are respectively placed at the four directions of the front view located in the center. Referring to the schematic structural diagram of the LED display panel A11 at five different viewing angles shown in FIG. 2, each LED display unit A1 includes a connection structure A12 and an LED display panel A11, where the connection structure A12 can be used to support the LED display panel A11 and for connection between adjacent LED display units A1. LED display panel A11 can be used to display images. In some embodiments, the outer edge of the connection structure A12 is flush with the outer edge of the LED display panel A11, so that the gap between adjacent LED display units A1 is reduced and even seamless splicing can be achieved.

In some embodiments, referring to FIG. 2, the LED display panel A11 may be overall rectangular as a whole, which may include oppositely arranged long sides and oppositely arranged short sides. In this way, the connection structure A12 can be a rectangular structure as a whole to match the overall shape of the LED display panel A11.

In an embodiment of the present disclosure, in the display device, the long side of the LED display panel A11 is generally disposed along the horizontal or nearly horizontal direction, and the short side of the LED display panel A11 is generally disposed along the vertical or nearly vertical direction, so that it can be more convenient to assemble and control the display device. In the present disclosure, the side (light emitting side) of the display device used to display an image during operation can be defined as the front side, and the side opposite to the light emitting side can be defined as the rear side. In this way, in the LED display unit A1, the LED display panel A11 is located in front of the connection structure A12. In the present disclosure, the long side direction of the LED display panel A11 may be defined as the row direction, and the short side direction of the LED display panel A11 may be defined as the column direction. In one embodiment of the present disclosure, the size of the display device in the row direction is larger than the size in the column direction, so that the display device appears as a large-sized landscape screen display device. Of course, in other embodiments of the present disclosure, the size of the display device in the row direction may also be smaller than the size in the column direction, so that the display device appears as a large-sized portrait screen display device. For convenience of expression, in this disclosure, the direction away from the splicing display module in the plane of the display device can be defined as the outer side, and the direction close to the splicing display module in the plane of the display device can be defined as the inner side; for example, the frame component is located at the outer side of the splicing display module, and the splicing display module is located on the inner side of the frame component.

In some embodiments, the connection structure A12 and the LED display panel A11 are detachably connected through a connection assembly. The connection assembly includes a first connecting member and a second connecting member that match with each other; wherein, the first connecting member may be provided at the front side of the connection structure A12 and the second connecting member may be provided at the rear side of the LED display panel A11. In this way, when assembling the display device, the frame assembly EE and the connection structure A12 of each LED display unit A1 can be assembled first to form a display device frame, and then the LED display panel A11 can be connected to the connection structure A12 of the display device frame to form a display device. On the one hand, this can reduce the risk of damaging the LED display panel A11 during the splicing process, and help improve the assembly speed and convenience; on the other hand, it can also help replace the damaged connection structure A12 or LED display panel A11, improving the maintenance convenience of the display device and reduced maintenance costs.

In a further embodiment, both the first connecting member and the second connecting member may be magnetic members, such as magnets. When the first connecting member and the second connecting member are aligned, they can be attracted together, thereby fixing the LED display panel A11 on the connection structure A12. In this regard, the LED display panel A11 can be installed and removed from the front, making the display device suitable for wall-mounting and other application scenarios, overcoming the problem in wall-mounting and other situations that the display device cannot be installed or maintained from the back.

In some embodiments, the connection structure A12 and the LED display panel A11 are connected through multiple sets of connection components to improve the stability of the connection between the connection structure A12 and the LED display panel A11. Furthermore, each connection component may be distributed relatively evenly, for example, each first connecting member may be uniformly distributed in an array on the connection structure A12. It can be understood that in other embodiments of the present disclosure, the spacing between the connecting components may also be irregular or partially irregular to facilitate the arrangement of the connection structure A12 and other structures on the LED display panel A11.

In some embodiments, the connection structure A12 may include a chassis A121 located on the periphery and a structural member fixed on the inner side of the chassis A121. In the embodiment, the outer edge of the chassis A121 can be flush with the outer edge of the LED display panel A11 and be rectangular, so as to facilitate splicing between the LED display units A1. The structural member can be fixedly connected to the chassis A121, and it can be provided with a port for electrical connection with the LED display panel A11, so as to facilitate providing power or signals to the LED display panel A11. Illustratively, in one embodiment of the present disclosure, the structural member is provided with a first signal port and a first power port facing the front direction, and the rear side of the LED display panel A11 is provided with a second signal port and a second power port matching the first signal port and the first power port respectively. When the LED display panel A11 is fixed to the connection structure A12 through the connecting component, the first signal port and the second signal port can match each other, so that the LED display panel A11 can perform signal interaction with external control components; the first power port and the second power ports can match each other so that the LED display panel A11 can obtain power supply from an external power source.

In an embodiment of the present disclosure, the control component may include a circuit board of the LED display panel A11, and the circuit board of the LED display panel A11 may be disposed on the structural component to drive the LED display panel A11 to display images. It can be understood that the circuit board of the LED display panel A11 may include one circuit board, or may include multiple circuit boards connected to the LED display panel A11, as long as it can drive the LED display panel A11 to display images. According to the different driving methods of the LED display panel A11, the circuit board of the LED display panel A11 can have different functional modules. For example, it can be provided with a source driving module, a gate driving module, a timing controller, etc. This disclosure does not limit this.

Optionally, the chassis A121 may include four chassis bars connected end to end in sequence, for example, two long chassis bars extending along the row direction and arranged oppositely, and two short chassis bars extending along the column direction and arranged oppositely.

In some embodiments, a chassis connector may be provided on the structural member, and two adjacent connection structures A12 may be connected to each other through the chassis connector. Furthermore, any chassis bar is provided with a chassis A121 connection hole running through towards an outer direction (that is, the chassis connection hole penetrates the chassis A121 in the row direction or column direction and is perpendicular to the extension direction of the chassis bar). A chassis connector may be provided on the chassis connector, and the chassis connector includes a latch member. When adjacent chassis bars of two adjacent chassis A121 are connected, the chassis connection holes of the two chassis bars can be aligned, and the latch member can be inserted into the chassis connection hole. In this way, the two chassis A121 are connected to each other under the constraints of the latch member and the chassis connection hole.

In an embodiment of the present disclosure, the chassis connector may also be provided with a latch adjustment member for adjusting the position of the latch member, thereby adjusting the flatness of the spliced piece of the connection structure to ensure that each LED display panel A11 of the display device is in the same plane.

In an embodiment of the present disclosure, on any chassis bar, at least one chassis connection hole can be provided to ensure that the connection structures A12 can be spliced arbitrarily.

When assembling the display device, each connection structure A12 can be spliced to each other first to form a connection structure spliced piece, and then the frame component EE is assembled outside the connection structure spliced piece to form a display device frame. Further optionally, when each connection structure A12 is spliced, the long sides or short sides of two adjacent connection structures A12 can be adjacent, so that the postures of each connection structure A12 remain consistent.

In some embodiments, multiple connection structures A12 can be pre-connected to form a pre-spliced piece of connection structures; multiple pre-spliced piece of connection structures can be connected to each other to form a required spliced piece of connection structures. In this way, each pre-spliced piece of connection structures can be directly transported to the application site, and the pre-spliced piece of connection structures can be spliced at the application site to form a display device frame. In this way, the assembly workload at the application site can be reduced, the splicing efficiency can be improved, and the splicing time can be reduced. More importantly, this can greatly reduce the need for professional operators during the splicing process and reduce the difficulty of the splicing operation, thereby reducing the cost of the splicing operation on the one hand, and reducing the risk of damage to the display device during the assembly process on the other. It can be understood that the pre-assembled connection structure is a structure formed outside the application site, for example, it is pre-generated during factory production or the display device supplier assembles it in advance in a pre-assembly workshop before going to the application site, as long as multiple connection structures A12 have been pre-connected when being transported to the application site.

In one embodiment of the present disclosure, the pre-spliced piece of connection structures may include a plurality of connection structures A12 that are arranged and connected sequentially along the column direction. In this way, when assembling the display device, each pre-spliced piece of connection structures can be spliced sequentially along the row direction to form a spliced of connection structure. In this way, it can be avoided that the size of the pre-spliced piece of connection structures is too long and difficult to transport and control the process size. In the present disclosure, the pre-spliced piece of connection structures and the LED display panel A11 connected thereto can be defined as a pre-assembled display module AA (a pre-assembled display module AA is indicated by hatching in FIG. 1), then the spliced display module MDL of the display device may include multiple pre-assembled display modules AA that are spliced to each other, and each pre-assembled display module AA may include multiple LED display units A1. Further, in each pre-assembled display module AA, each connection structure A12 is pre-connected to form a pre-spliced piece of connection structures, and each LED display panel A11 can be detachably connected to the connection structure A12.

As an example, FIG. 1 shows a display device with 25 LED display units A1. In the embodiment, the spliced display module MDL of the display device has five pre-assembled display modules AA, and the five pre-assembled display modules AA are spliced sequentially along the row direction. Any pre-assembled display module AA includes five LED display units A1 that are spliced sequentially along the column direction.

Figure 3:
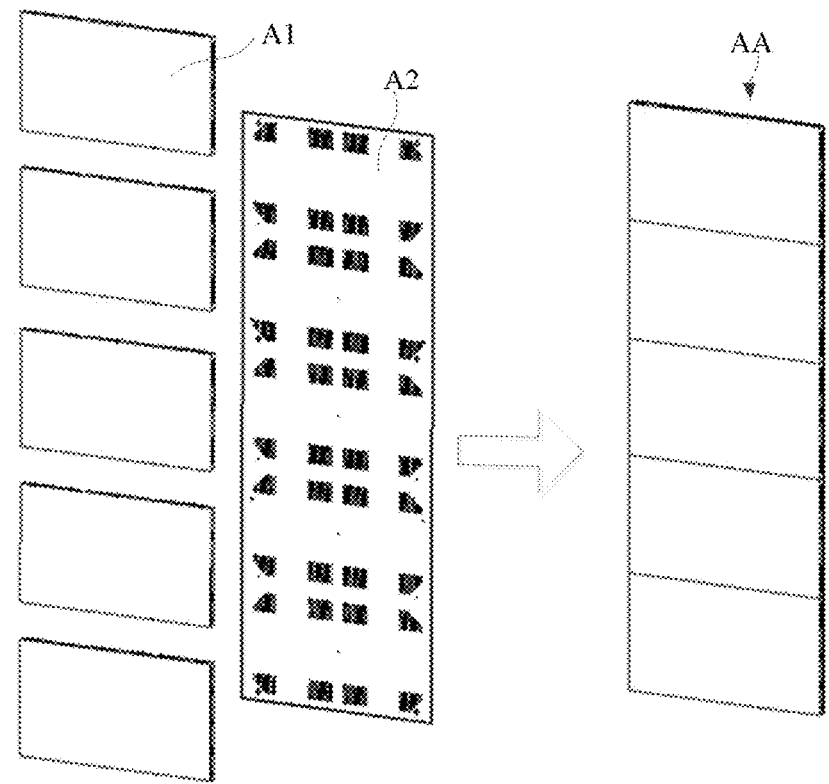
FIG. 3 is a schematic diagram of the disassembly and assembly structure of the pre-assembled display module in an embodiment of the present disclosure.

In some embodiments, see FIG. 3, in addition to using chassis connectors to connect the connection structures A12 of each LED display unit A1 in the pre-spliced piece of connection structures, they can also be connected through the backplane A2. In other words, the pre-spliced piece of connection structures may include a backplane A2 and a plurality of connection structures A12. Adjacent connection structures A12 are connected to each other and each connection structure A12 is connected to the backplane A2. In the embodiment, the backplane A2 may be disposed on the rear side of the connection structure A12. Illustratively, in one embodiment of the present disclosure, the pre-assembled display module AA may include a pre-spliced piece of connection structures and an LED display panel A11 fixed on each connection structure A12 of the pre-spliced piece of connection structures; any one pre-spliced piece of connection structures includes a plurality of connection structures A12 connected in sequence along the column direction, and a backplane A2 located on the rear side of the connection structure A12 and connected to each connection structure A12.

Optionally, the connection structure A12 may be provided with a bolt post for connecting with the backplane A2, and the backplane A2 may be connected with the bolt post. The number of bolt post may be multiple to improve the connection strength between the backplane A2 and the connection structure A12. For example, the number of bolt posts is four, and they are rectangularly distributed near the four corners of the connection structure A12. Further optionally, bolt posts are provided on the structural member. Of course, in other embodiments of the present disclosure, other detachable connection methods can also be used between the backplane A2 and the connection structure A12.

It can be understood that in other embodiments of the present disclosure, in the pre-spliced piece of connection structures, each connection structure A12 can also be fixed and connected in a non-detachable manner, such as by welding. Alternatively, the chassis A121 of each connection structure A12 in the pre-spliced piece of connection structures is made into an integrally formed structure. Correspondingly, in the pre-spliced piece of connection structures, the connection structure A12 and the backplane A2 can also be connected using a non-detachable connection method, such as welding and other methods for fixing.

Optionally, referring to FIG. 2, a frame connection hole HD may be provided on the chassis A121 to facilitate the fixation of the chassis A121 located at the edge of the spliced piece of connection structure to the frame assembly EE. Furthermore, the frame connection hole HD can be provided on each frame of the chassis A121, so that the connection structures A12 can be spliced according to needs, thereby improving the versatility of the connection structure A12 and thereby reducing the cost of the display device. In an embodiment of the present disclosure, referring to FIG. 2, at least one frame connection hole HD can be provided on any chassis bar. For example, in one embodiment of the present disclosure, three frame connection holes HD can be provided on the long chassis bar, and two frame connection holes HD can be provided on the short chassis bar.

Further, the frame connection hole HD may be a threaded hole, and the frame assembly EE and the chassis A121 may be connected through screws DD1 mated with the frame connection hole HD. In other words, the display module MDL may include a plurality of interconnected connection structures and a plurality of LED display panels located on each connection structure; and the connection structure has a frame connection hole that can be connected to the frame assembly through screws.

Optionally, the frame connection hole HD may be opened toward the outer side of the connection structure A12, that is, it may extend along the row direction or the column direction and be perpendicular to the extension direction of the chassis bar.

Figure 9:
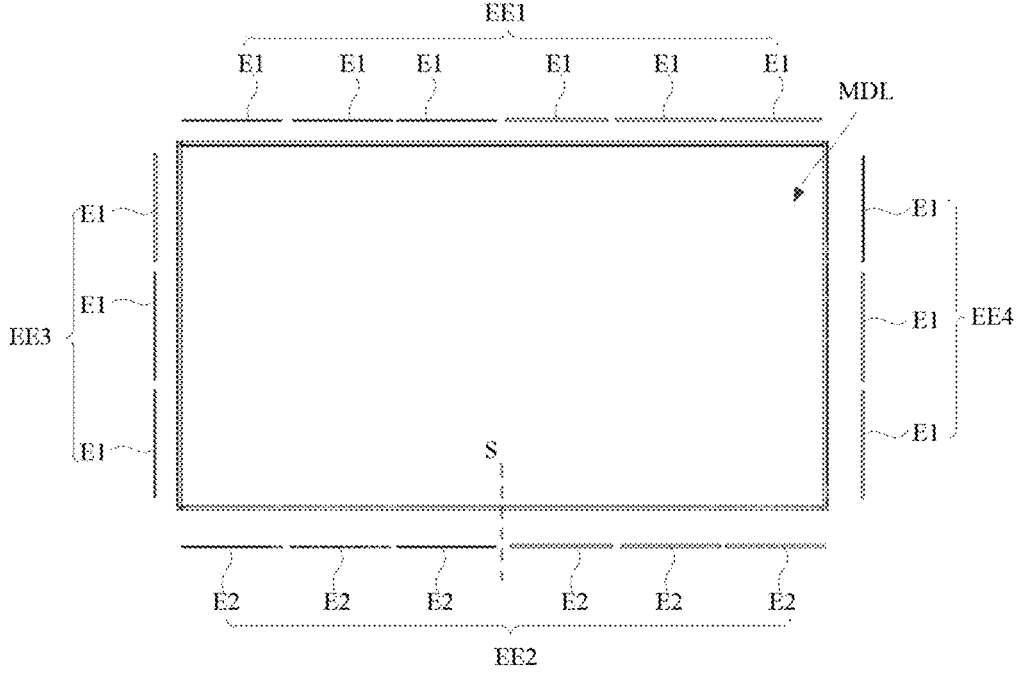
FIG. 9 is a schematic diagram of the disassembled structure of a display device in an embodiment of the present disclosure.

In the present disclosure, referring to FIG. 9, the frame component EE is arranged around the display module MDL, which may include a top frame EE1 located on the upper side of the display module MDL, a bottom frame EE2 located on the lower side of the display module MDL, and side frames located on both sides of the display module MDL in the row direction, in the embodiment, the side frames include a left frame EE3 and a right frame EE4. An insertion hole may be connected to the top edge of the spliced piece of connection structure, for example, connected to the frame connection hole HD on the top edge of the spliced piece of connection structure through a screw.

The lower frame EE2 can be connected to the bottom edge of the spliced piece of connection structure, for example, connected to the frame connection hole HD on the bottom edge of the spliced piece of connection structure by a screw. The left frame EE3 can be connected to the left edge of the spliced piece of connection structure, for example, connected to the frame connection hole HD on the left edge of the spliced piece of connection structure by a screw. The right frame EE4 can be connected to the right edge of the spliced piece of connection structure, for example, connected to the frame connection hole HD on the right edge of the spliced piece of connection structure by a screw. In the present disclosure, the left direction and the right direction are two opposite directions in the row direction of the LED display panel A11. In an embodiment of the present disclosure, the user can observe in front of and toward the display device, the user's left direction is the left direction in this disclosure, and the user's right direction is the right direction in this disclosure.

In some embodiments, the top frame EE1, the left frame EE3 and the right frame EE4 have the same structure, for example, have the same or substantially the same cross-sectional shape. In an embodiment of the present disclosure, referring to FIG. 9, any one of the top frame EE1, the left frame EE3, and the right frame EE4 may include one first frame E1 or multiple spliced first frames E1. In this way, the top frame EE1, the left frame EE3 and the right frame EE4 can share the mold to save production costs of the profiles. Furthermore, the length of the first frame E1 may be no more than 2 meters, so as to avoid the increase in production cost and the reduction in process accuracy caused by the length of the first frame E1 being too long.

Figure 4:
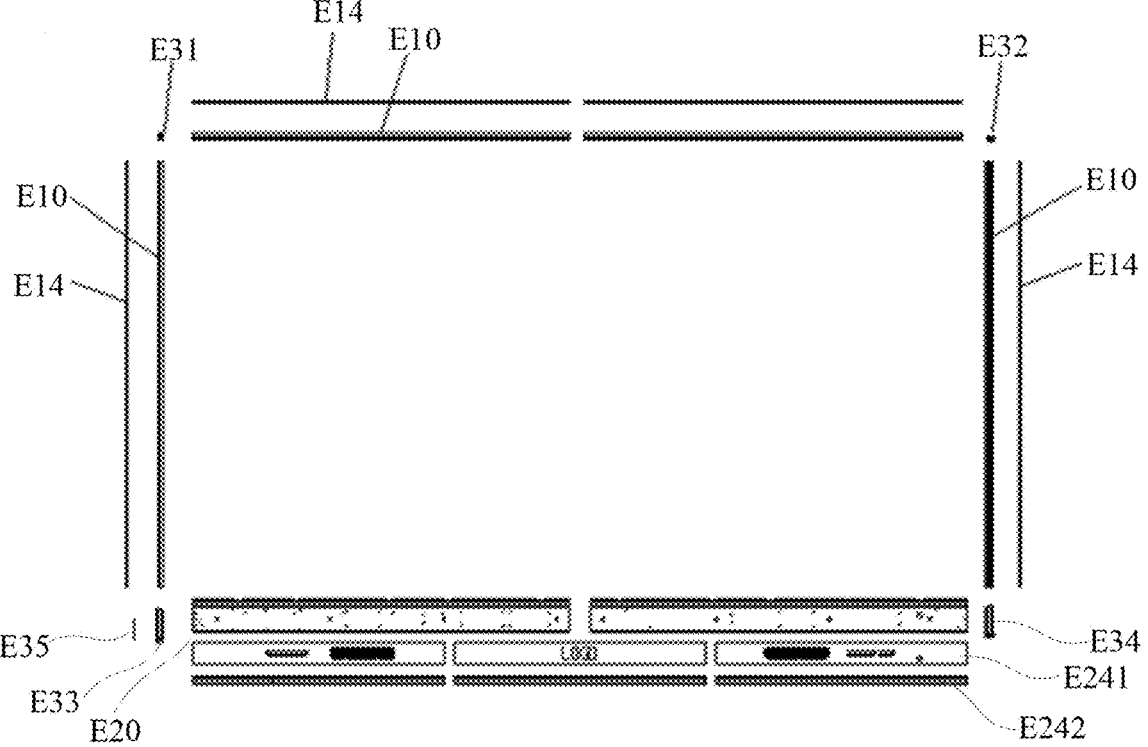
FIG. 4 is a schematic exploded structural view of the frame assembly in an embodiment of the present disclosure.
Figure 5:
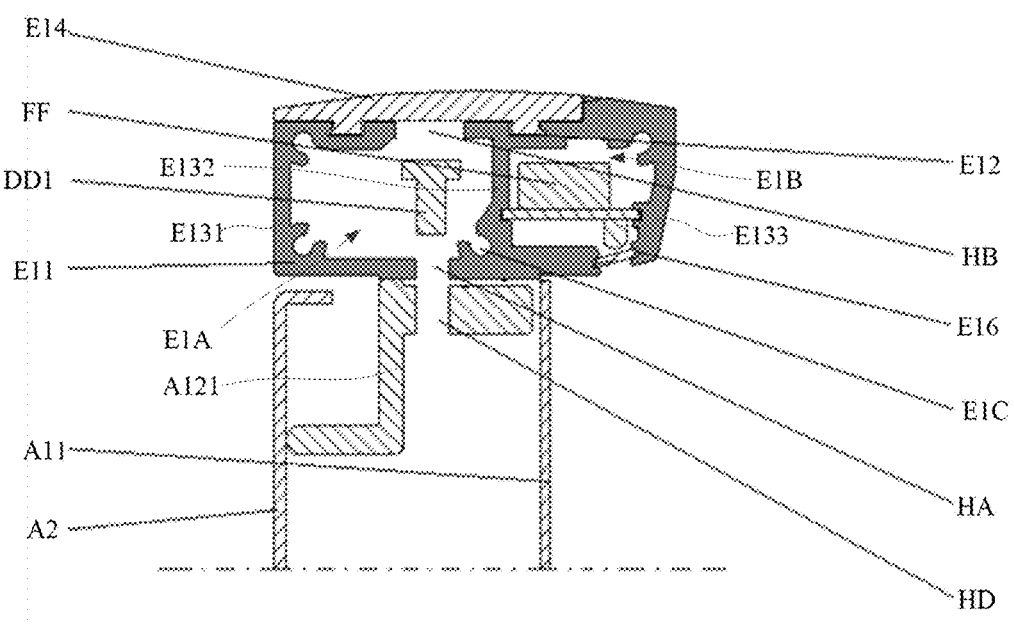
FIG. 5 is a schematic diagram of the connection structure between the first frame and the pre-assembled display module in an embodiment of the present disclosure.

FIG. 5 shows a schematic structural diagram of a connection method between the first frame E1 and the display module MDL. Referring to FIGS. 4 and 5, the first frame E1 may be provided with a first cavity E1A to reduce the frame weight and reduce the frame cost. The first frame E1 and the display module MDL may be connected through a screw, wherein the end cap of the screw may be located in the first cavity E1A. In this way, the screws can be hidden in the first frame E1, thereby preventing the screws from being exposed, which is beneficial to improving the appearance of the display device, improving the user experience, and improving the overall display effect of the display device.

In some embodiments, referring to FIGS. 4 and 5, the first frame E1 may have a first frame body E10, and the first frame body E10 may be a hollow profile with an oppositely disposed first inner side wall E11 and a first outer side wall E12, and a connecting side wall between the first inner side wall E11 and the first outer side wall E12. The first inner side wall E11 is disposed close to the display module MDL, and the first outer side wall E12 is located on the side of the first frame E1 away from the display module MDL. Further, the first inner side wall E11, the first outer side wall E12 and the connecting side wall all extend along the extension direction of the first frame E1.

Alternatively, the connecting side wall may include a first connecting side wall E131 and a second connecting side wall E132, with the first connecting side wall E131 being located on the rear side of the second connecting side wall E132. In this way, the first connecting side wall E131, the second connecting side wall E132, the first inner side wall E11 and the first outer side wall E12 form the first cavity E1A. The extension direction of the first cavity E1A is consistent with the extension direction of the first frame E1, and the first cavity E1A runs through the first frame E1 along the extension direction of the first frame E1.

Optionally, the first inner side wall E11 and the first outer side wall E12 are respectively formed with an inner screw mounting hole HA and an outer screw mounting hole HB that are aligned with each other; the screw DD1 passes through the inner screw mounting hole HA and is connected to the display module MDL; the outer screw mounting hole HB is used to facilitate the use of installation tools when tightening the screw. For example, when using a screw to securely install the first frame and the display module, a screwdriver and other installation tools can pass through the outer screw mounting holes HB to tighten the screws to improve the installation strength of the frame.

In one embodiment of the present disclosure, referring to FIG. 5, the screw DD1 can penetrate into the inner screw mounting hole HA and the frame connection hole HD, and the end cap of the screw can resist against the first inner side wall E11 to achieve the stable connection between first frame E1 and connection structure A12. Not only that, this also allows the end cap of the screw to be located in the first cavity E1A, thereby shielding the screw, thereby improving the aesthetics of the display device. It can be understood that when the first inner side wall E11 is provided with a counterbore for accommodating all or part of the end cap of the screw, the counterbore is connected to the first cavity and serves as a part of the first cavity.

Furthermore, the size of the screw mounting hole HC on the first outer side wall E12 may be larger than the size of the screw mounting hole HC on the first inner side wall E11 to facilitate the insertion of screws into the first cavity E1A or the tightening of the screws.

For example, in one embodiment of the present disclosure, after the inner screw mounting hole HA is aligned with the corresponding frame connection hole HD, the screw can be inserted through the screw mounting hole HC of the first outer side wall E12, and the screw can be tightened through the outer screw mounting hole HB, so that the screw is screwed into the inner screw mounting hole HA and the frame connection hole HD, and the end cap resists against the first inner side wall E11. Furthermore, the inner screw mounting hole HA and the outer screw mounting hole HB may be oblong holes extending along the length direction of the first frame E1 to adjust the alignment of the inner screw mounting hole HA and the outer screw mounting hole HB with the frame connection hole HD, such as reducing the splicing slits of frame components.

Figure 12:
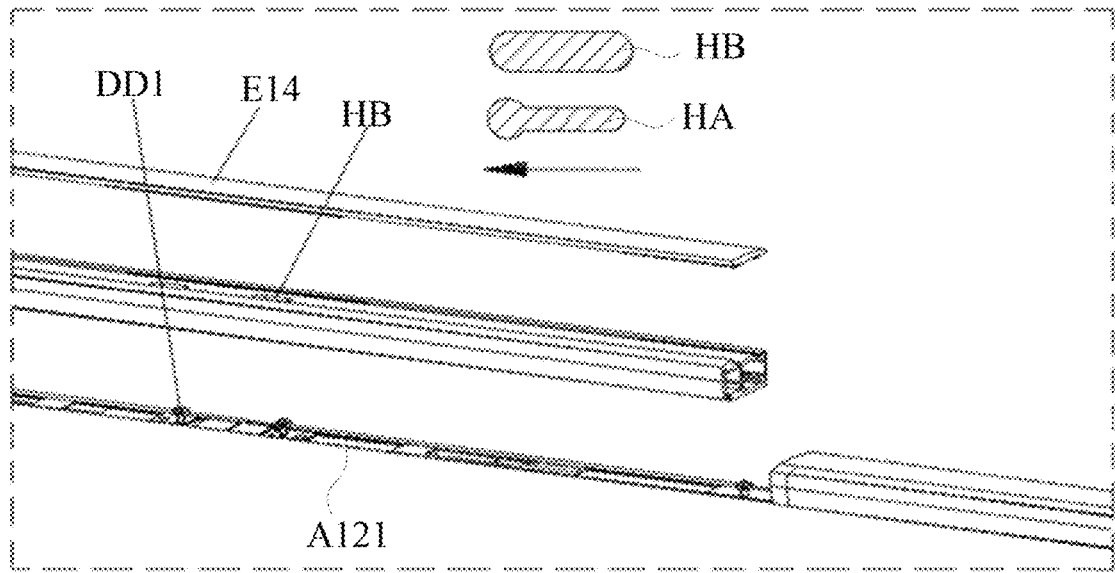
FIG. 12 is a schematic structural diagram of connecting the first frame to the connection structure in an embodiment of the present disclosure.

As another example, in another embodiment of the present disclosure, referring to FIG. 12, the inner screw mounting hole HA is a wall-mounting hole extending along the extension direction of the first frame E1. Referring to FIG. 12, the wall-mounting hole includes an insertion hole at one end and a long hole connected to the insertion hole. In the embodiment, the penetration hole can allow the end cap of the screw to pass through; the long hole can allow the screw rod of the screw to pass through but does not allow the end cap of the screw to pass through. Illustratively, the size of the insertion hole is larger than the end cap of the screw, and the width of the long hole is larger than the diameter of the screw rod of the screw and smaller than the diameter of the end cap of the screw. In this way, when installing the first frame E1, the screw DD1 can be pre-installed on the chassis A121 first. There is a gap between the end cap of the screw and the chassis A121 of the connection structure A12 that can accommodate the first inner side wall E11; then, the first frame E1 can be hung on the screw. Specifically, the end cap of the screw can be made passes through the insertion hole, then the first frame E1 can be moved so that the screw rod of the screw penetrates into the long hole; then, after aligning the frame assembly, the screw can be tightened through the outer screw mounting hole HB, so that the first frame E1 and the connection structure A12 are fixed by the screw. Further, the insertion hole of the inner screw mounting hole HA is a round hole. In this embodiment, the outer screw mounting hole HB is capable of allowing a tool to tighten the screw, and may be, for example, an oblong hole extending along the extension direction of the first frame E1.

In some embodiments, the side frame (either the left frame or the right frame) includes a first frame or a plurality of first frames spliced along a straight line, and the penetration hole in the first frame is located below the long hole.

In some embodiments, the top frame includes one first frame or a plurality of first frames spliced along a straight line. In each wall-mounting hole of the top frame, the penetration hole is located on the same side of the long hole. In some embodiments, referring to FIG. 5, the first frame E1 may further include a frame cover E14, which is detachably connected to the first outer side wall E12 and covers the outer screw mounting hole HB. In this way, the outer screw mounting holes HB and screws are not visible on the top frame and side frames as a whole, further improving the cleanliness of the appearance of the display device.

Further, when a plurality of first frames are spliced in sequence along a straight line, the frame covers of the plurality of first frames that are spliced in sequence along a straight line have an integrated structure. For example, when the top frame includes a plurality of first frames that are spliced in sequence, the frame cover of the top frame can be an integrated piece and matches with each first frame to improve the integrity of the top frame. As another example, when the left frame or the right frame includes a plurality of first frames that are spliced in sequence, the frame cover of the left frame or the right frame can be an integrated piece and matches with each first frame to improve the integrity of the side frame.

For example, in one embodiment of the present disclosure, the first outer side wall E12 of the first frame E1 may be provided with a slide groove extending along the extension direction of the first frame E1, with the opening of the slide groove facing the outer side of the first frame E1. The frame cover E14 may have a slide bar that matches with the slide groove, and a guide rail-slide block mechanism is formed between the slide bar and the slide groove. In this way, the frame cover E14 can be used as a sliding cover to cover or expose the outer screw mounting hole HB in a sliding manner.

Further, the number of slide grooves may be two, and the two slide bars are respectively located on both sides of the outer screw mounting hole HB.

Optionally, the first outer side wall E12 of the frame cover E14 and the surface of the first outer side wall E12 not covered by the frame cover E14 are smoothly connected, so that the overall appearance of the frame is more artistic.

In some embodiments, referring to FIG. 5, the connecting side wall may further include a third connecting side wall E133, and the third connecting side wall E133 is connected to the front end of the first outer side wall E12. Further, the third connecting side wall E133 extends along the extension direction of the first frame E1. In this way, the first connecting side wall E131, the second connecting side wall E132 and the third connecting side wall E133 are arranged in sequence from the rear side to the front side.

Figure 8:
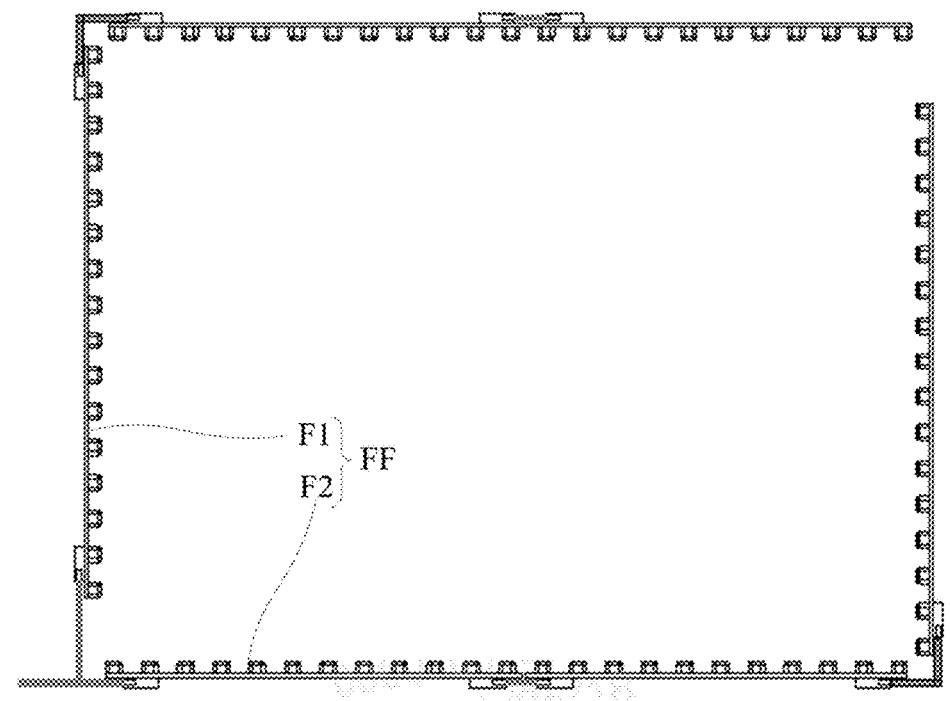
FIG. 8 is a schematic structural diagram of an infrared touch component in an embodiment of the present disclosure.

The first inner side wall E11, the first outer side wall E12, the second connecting side wall E132, and the third connecting side wall E133 may encircle to form the first infrared cavity E1B for accommodating the infrared touch component FF. Referring to FIG. 8, the infrared touch component FF may include an infrared emitter bar F2 and an infrared receiver bar F1, and one of the infrared emitter bar F2 and the infrared receiver bar F1 is set in any frame. In the embodiment, the infrared transmitter bar F2 is provided with an infrared transmitter for emitting infrared rays, and the infrared receiver bar F1 is provided with an infrared receiver for detecting infrared rays. In the display device, the infrared emitter bar F2 and the infrared receiver bar F1 are arranged oppositely on both sides of the display module MDL to implement the touch function.

Referring to FIG. 5, the first inner side wall E11 and the first outer side wall E12 are extended beyond the LED display panel A11 in the front direction; and a first light-transmitting slit communicated with the first infrared cavity E1B is formed between the first inner side wall E11 and the third connecting side wall E133. In the embodiment, the first light-transmitting slit is located in front of the LED display panel A11. In the display device, infrared light can be emitted through the first light-transmitting slit or enter the first infrared cavity E1B.

Optionally, referring to FIG. 5, the opposite surfaces of the second connecting side wall and the third connecting side wall can be provided with infrared fastening grooves, and the infrared touch component FF in the first infrared cavity E1B can be fixed through the infrared fastening grooves, so that the device (such as an infrared transmitter or an infrared receiver) on the infrared touch component FF is aligned to the first light-transmitting slit.

Optionally, referring to FIG. 5, a first infrared filter bar E16 may be provided in the first light-transmitting slit to improve the accuracy of infrared touch and reduce external interference. Furthermore, a filter bar slide groove can be provided on the side wall surface of the first light-transmitting slit, and the first infrared filter bar E16 can be inserted into the filter bar slide groove to achieve light filtering and seal the first infrared cavity E1B.

In some implementations, referring to FIG. 9, the top frame EE1, the left frame EE3, or the right frame EE4 can be formed by splicing multiple first frames E1. In this way, it is possible to avoid these bezel sizes being too long and difficult to transport and prepare. Further, referring to FIG. 11, two adjacent first frames E1 may be connected by a pin E15.

Optionally, referring to FIG. 5, the end of the first frame E1 may be provided with a plurality of pin holes E1C, and the pin holes E1C extend along the extension direction of the first frame E1. When two adjacent first frames E1 are aligned, each pin hole E1C can be aligned. In this way, the pin E15 can be inserted into two adjacent pin holes E1C, so that the two first frames E1 adjacent along a straight line are connected through the pin E15. Furthermore, there can be an interference connection between the pin E15 and the pin hole E1C. In other words, pin holes are provided at both ends of the first frame, and two first frames adjacently spliced along a straight line are connected by pins inserted into the pin holes. It can be understood that the adjacent first frames located on different sides of the display module that are not arranged along a straight line, and the adjacent the first frame of the top frame and the first frame of the side frame at the corners that are not adjacent along a straight line, are not included in the case of being arranged in a straight line of the present disclosure.

Figure 11:
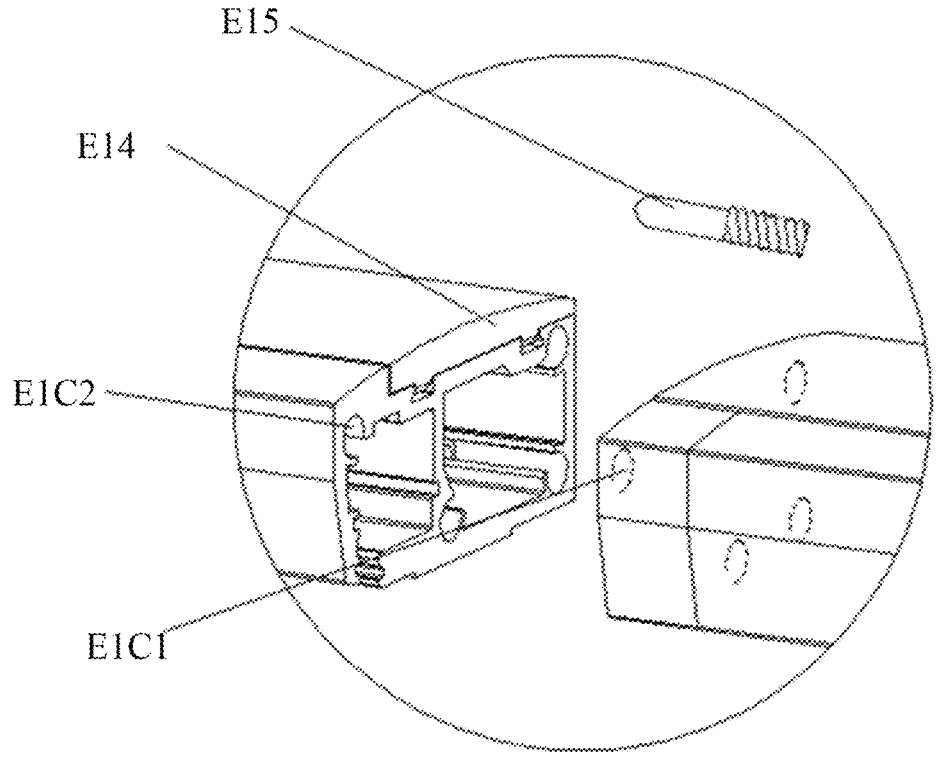
FIG. 11 is a schematic structural diagram of two first frames spliced together in an embodiment of the present disclosure.

In one embodiment of the present disclosure, referring to FIG. 11, the pin hole E1C at one end of the first frame E1 is a first pin hole E1C1 with threads, and the pin hole E1C at the other end is a second pin hole E1C2 without threads.

One end of the pin E15 has a thread that matches the first pin hole E1C1, and the other end is a pin rod that interference fits with the second pin hole E1C2. In other words, the pin E15 includes a threaded section that fits with the first pin hole ElC1 and a pin rod section that interference fits with the second pin hole E1C2. When splicing the first frame E1, the first pin hole E1C1 of one first frame E1 can be threadedly connected to the pin E15, and then the pin rod can be interference-fitted with the second pin hole E1C2 of the other first frame E1, and then realize the splicing of the two first frames E1. This can improve the bonding strength of the two first frames E1 and achieve a seamless splicing effect.

In an embodiment of the present disclosure, in the side frame, the pin hole at the lower end of the first frame is a first pin hole, and the pin hole at the upper end of the first frame is a second pin hole. In the top frame, the first pin holes of each first frame are located at the same end of the first frame.

In an embodiment of the present disclosure, the pin hole E1C may be provided inside the first frame E1, for example, in the first cavity E1A. When the first frame E1 has the first infrared cavity E1B, the first infrared cavity E1B may also be provided with a pin hole E1C. This avoids breaking the overall appearance of the frame.

Further, a protruding portion is provided in the cavity inside the first frame E1, such as the first cavity E1A and the first infrared cavity E1B, and a pin hole E1C can be formed on the protruding portion. Optionally, the protruding portion also has an opening slit that communicates with the pin hole and extends along the extension direction of the first frame to facilitate the molding and preparation of the first frame E1. Optionally, the protruding portion and pin hole E1C may extend along the extending direction of the top frame and pass through the top frame. Optionally, three pin holes E1C are provided in the first cavity E1A, respectively located at the angle between the first outer side wall E12 and the first connecting side wall E131, the angle between the first inner side wall E11 and the first connecting side wall E131, and the angle between the first inner side wall E11 and the second connecting side wall E132. Optionally, a pin hole E1C may be provided in the first infrared cavity E1B, located at the angle between the first outer side wall E12 and the third connecting side wall E133.

In an embodiment of the present disclosure, the top frame EE1, the left frame EE3, or the right frame EE4 may be divided into multiple pre-spliced segments, and each pre-spliced segment may include multiple spliced first frames E1. When transporting the relevant parts of the display device to the application site, each pre-spliced segment can be directly transported to reduce the splicing workload at the application site. For example, referring to FIG. 4, the top frame EE1 can be divided into two pre-spliced segments of equal length, and each pre-spliced segment can include a plurality of first frames E1 (including the first frame body E10 and the frame cover E14). As another example, the left frame EE3 and the right frame EE4 can be spliced before being transported to the application site. In this way, there is no need to splice the first frame E1 to form the left frame EE3 and the right frame EE4 at the application site, while the left frame EE3 and the right frame EE4 can be directly installed on the spliced piece of connection structure.

In some implementations, referring to FIG. 9, the lower frame EE2 may include one second frame E2 or a plurality of spliced second frames E2. In the embodiment, referring to FIGS. 4 and 6, the second frame E2 may include a second frame body E20 and a front cover E24 that match each other. The front cover E24 and the second frame body E20 are detachably connected. The second frame body E20 includes a second inner wall E21, a second outer wall E22, and a rear side wall E23. The second inner wall E21 is located close to the display module MDL, and the second outer wall E22 is located on the side of the bottom frame away from the display module MDL. The rear side wall E23 connects the rear ends of the second inner wall E21 and the second outer wall E22. Further, the second inner side wall E21, the second outer side wall E22, the rear side wall E23 and the front cover E24 all extend along the extension direction of the lower frame EE2.

In the embodiment, a second cavity E2A for accommodating the system control component BB is formed between the second inner wall E21, the second outer wall E22, the rear side wall E23 and the front cover E24, and the front cover E24 and the bottom wall are detachably connected. In this way, the system control component BB of the display device can be accommodated in the second cavity E2A for controlling the control components of each LED display panel A11. When the system control component BB of the display device needs maintenance, the front cover E24 can be opened, and then the system control component BB in the second cavity E2A can be maintained. Therefore, the system control component BB of the display device of the present disclosure is disposed in the lower frame EE2, and can be maintained on the front of the display device, overcoming the disadvantage that it is difficult to perform maintenance on the back when the display device is mounted on a wall.

Optionally, in the second cavity E2A, a mounting rib E25 is provided on the rear side wall E23; and the system control component BB is installed on the mounting rib E25.

Figure 6:
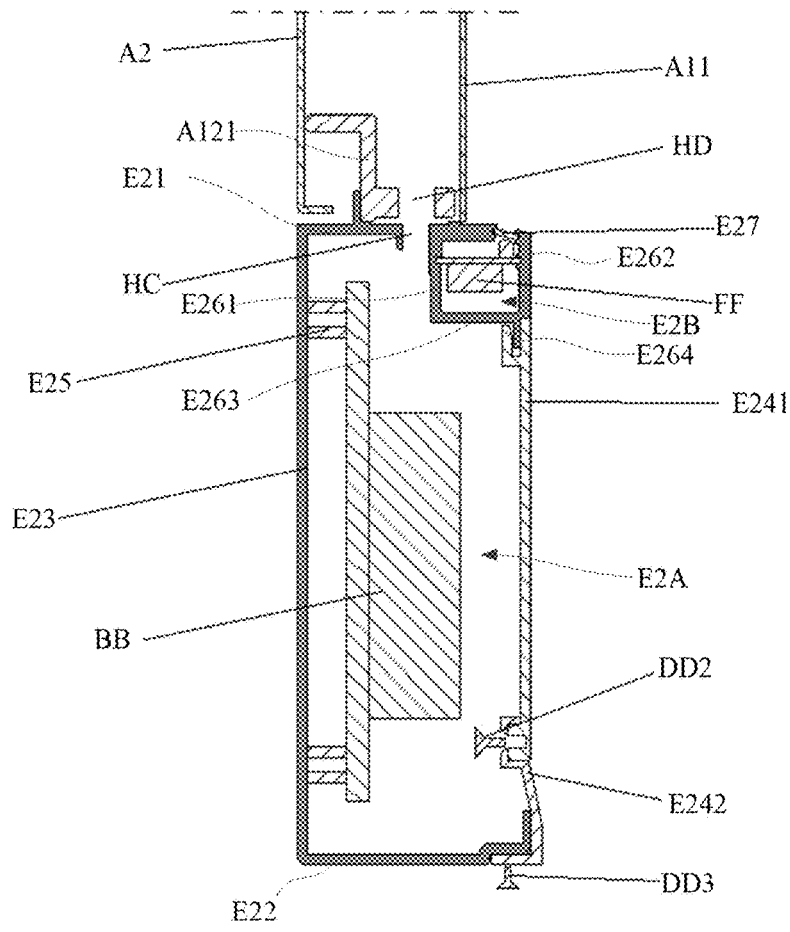
FIG. 6 is a schematic diagram of the connection structure between the second frame and the pre-assembled display module in an embodiment of the present disclosure.

Referring to FIG. 6, the second inner wall E21 may be provided with a screw mounting hole HC; in the display device, the screw mounting holes HC may be aligned with the frame mounting hole. In this way, the screw can be passed through the screw mounting hole HC and the frame mounting hole, so that the display module MDL and the lower frame EE2 are fixedly connected. In this way, the screw is hidden in the second cavity E2A to prevent the screw from being exposed. In one embodiment of the present disclosure, the screw mounting hole HC may be a round hole. It can be understood that the second inner wall E21 may also be provided with a counterbore for accommodating or partially accommodating the screw, and the counterbore may be used as a part of the second cavity.

Optionally, the second inner side wall E21 may also have a reinforcing wall extending inward, and the reinforcing wall resists against the rear side of the chassis A121 to improve the bonding strength between the lower frame EE2 and the display module MDL. Further, the reinforcing wall extends along the extension direction of the lower frame EE2 across the lower frame EE2.

Optionally, the lower frame EE2 may also have a first vertical wall E261, a second vertical wall E262 and a horizontal wall E263; the second inner side wall E21 extends forward to the front of the LED display panel A11, and the first vertical wall E261 is connected to the front end of the inner wall E21 and is extended outward (away from the display module MDL, that is, downward); the second vertical wall E262 is connected to the second inner wall E21 and is extended outward, and is disposed between the first vertical wall E261 and the screw mounting hole HC. The first horizontal arm is connected to the outer ends of the first vertical wall E261 and the second vertical wall E262. In this way, the second inner wall E21, the first vertical wall E261, the second vertical wall E262 and the horizontal wall E263 form a second infrared cavity E2B for accommodating the infrared touch component FF, so that the display device has a touch function. Referring to FIG. 6, a second light-transmitting slit communicating with the second infrared cavity E2B may be formed between the portion of the second inner wall E21 protruding from the LED display panel A11 and the second vertical wall, so that the infrared touch component FF in the second inner wall E21 can receives infrared ray or emits infrared ray through the second light-transmitting slit. Further, the first vertical wall E261, the second vertical wall E262 and the horizontal wall E263 extend along the extension direction of the lower frame EE2 across the lower frame EE2.

Optionally, referring to FIG. 6, the opposite surfaces of the first vertical wall E261 and the second vertical wall E262 can be provided with an infrared fastening groove, and the infrared touch component FF in the second infrared cavity E2B can be fixed through the infrared fastening groove, so that the device (such as an infrared transmitter or an infrared receiver) on the infrared touch component FF is aligned to the second light-transmitting slit.

Optionally, referring to FIG. 6, a second infrared filter bar E27 may be provided in the second light-transmitting slit to improve the accuracy of infrared touch and reduce external interference. Further, a filter bar slide groove can be provided on the side wall surface of the second light-transmitting slit, and the second infrared filter bar E27 can be inserted into the filter bar slide groove to achieve light filtering and seal the second infrared cavity E2B.

Optionally, referring to FIG. 6, the horizontal wall E263 is provided with an inserting plate E264 extending toward the outside (lower end); the inner side end of the front cover E24 is provided with a slot that matches the inserting plate E264. When assembling the front cover E24, the slot can be matched with the inserting plate E264 first, and then the outer end of the front cover E24 is fixed with the second outer wall E22. Further, the inserting plate E264 extends along the extension direction of the lower frame EE2 across the lower frame EE2.

Further, when the slot is matched with the inserting plate E264, the joint between the first vertical wall E261 and the front cover E24 smoothly transitions, for example, the front surfaces of the two are located on the same plane.

In one embodiment of the present disclosure, the front cover E24 may include a cover portion E241 and a connecting portion E242. The outer side end (lower end) of the cover portion E241 is connected to the inner side end (upper end) of the connecting portion E242, for example, detachably connected by a screw DD2 or the like to improve the versatility of display device parts. The outer side end (lower end) of the connecting portion E242 is detachably connected to the second outer wall E22, for example, by a screw. For example, the lower end of the connecting portion E242 is bent below the second outer side wall, and resists against with the outer surface of the second outer side wall E22 and is fixed by a screw DD3.

Optionally, the overall color tone of the cover portion E241 may be consistent with or close to the color tone of the LED display panel A11, and the overall color tone of the connection portion E242 may be consistent with or close to the color tone of the front of the first frame E1. In this way, the appearance of the products in the display device can be unified and the overall display effect can be improved.

Optionally, the cover part E241 may also be provided with heat dissipation holes, speaker holes, identification plates, etc., to meet the functional and display requirements of the display device, and this disclosure is not limited here.

In some embodiments, a splicing hole for splicing can be provided at each end of the second frame E2, and two adjacent second frames E2 can be spliced by the matching of a pin and the splicing hole, thereby splicing the complete lower frame EE2.

In an embodiment of the present disclosure, the lower frame EE2 may be divided into multiple pre-spliced segments, and each pre-spliced segment may include multiple spliced second frames E2. When transporting the relevant parts of the display device to the application site, each pre-spliced segment can be directly transported to reduce the splicing workload at the application site. For example, the lower frame EE2 may be divided into two pre-spliced segments of equal length, and each pre-spliced segment may include a plurality of second frames E2.

Optionally, in the present disclosure, referring to FIG. 8, the infrared touch component FF may include multiple infrared emitter bars F2 and multiple infrared receiver bars F1, and the multiple infrared emitter bars F2 may be electrically connected in series connection, multiple infrared receiver bars F1 can be electrically connected in series connection. For example, in one embodiment of the present disclosure, the infrared emitter bar F2 may be provided on the lower frame EE2 and the left frame EE3, and the infrared receiver bar F1 may be provided on the right frame EE4 and the top frame EE1. It can be understood that in other embodiments of the present disclosure, the positions of the infrared emitter bar F2 and the infrared receiver bar F1 can be adjusted as needed.

Figure 7:
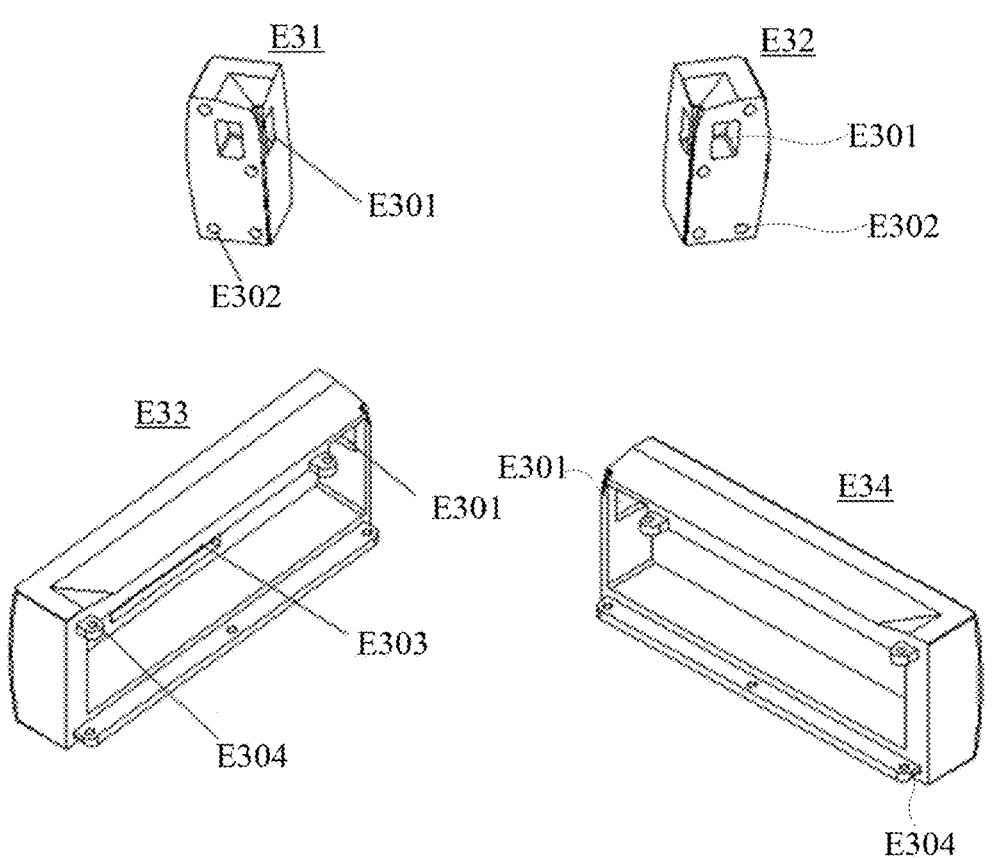
FIG. 7 is a schematic structural diagram of four corner pieces in an embodiment of the present disclosure.

In some embodiments, referring to FIGS. 4 and 7, the frame assembly EE may further include corner pieces located at four top corners, and the corner pieces are connected to the first frame or the second frame. Specifically, the corner pieces may include upper corner pieces (upper left corner piece E31, upper right corner piece E32) and lower corner pieces (lower left corner piece E33, lower right corner piece E34).

In some embodiments, the top frame EE1 and the left frame EE3 are connected through the upper left corner piece E31, the top frame EE1 and the right frame EE4 are connected through the upper right corner piece E32, the lower frame EE2 and the left frame EE3 are connected through the lower left corner piece E33, and the lower frame EE2 and the right frame EE4 are connected through the lower right corner piece E34. In this way, the frame component EE can include the top frame EE1, the lower frame EE2, the left frame EE3, the right frame EE4 and four corner pieces, which can make the top frame EE1, the lower frame EE2, the left frame EE3, and the right frame EE4 interlock with each other. Thus, the integrity of the appearance of the frame component EE is improved, and the overall display effect and user experience of the display device are improved.

In some other embodiments, if allowed by the process tolerance, the lower corner piece and the lower frame can be connected by a screw; the side frame and the upper corner piece and the lower corner piece can be connected by a pin. The pin includes a threaded segment and a pin rod segment. In the embodiment, the lower corner piece is threadedly connected to the threaded segment of the pin, and the lower end of the side frame is interference fit with the pin rod segment of the pin; the upper end of the side frame is threadedly connected to the threaded segment of the pin, and the upper corner piece is interference fit with the pin rod segment of the pin. In one embodiment of the present disclosure, the upper corner piece is provided with a connection hole for connecting to the top frame and a connection hole E302 for connecting to the side frame (left frame EE3 or right frame EE4), and the upper corner piece is connected to the top frame EE1 and the side frame can be connected by a screw, a pin E15 or a threaded pin E15.

Optionally, the upper corner piece is provided with a corner cavity E301. When the upper corner piece, top frame and side frame are connected to each other, one opening of the corner cavity is aligned with the first infrared cavity E1B of the top frame EE1, and the other opening of the corner cavity is aligned with the first infrared cavity EB of the side frame. In this way, the first infrared cavity E1B of the side frame and the top frame EE1 are connected to each other, which facilitates the layout and wiring of the infrared touch component FF of the display device. For example, the infrared touch component FF in the first infrared cavity E1B of the top frame EE1 can be electrically connected to the infrared touch component FF in one side frame through the corner cavity.

Furthermore, the front surface of the upper corner piece can also be provided with chamfers to match the shapes of the front surfaces of the top frame EE1 and the side frames, thereby improving the consistency of the frame assembly EE.

In one embodiment of the present disclosure, the lower corner piece is provided with a connection hole E304 for connecting with the lower frame EE2. Further, the lower corner piece and the lower frame EE2 may be connected by a screw.

Optionally, the lower corner piece is provided with a wiring cavity connected to the second cavity E2A to facilitate circuit wiring of the display device. Furthermore, the lower corner piece has a corner cavity E304 aligned with the first infrared cavity E1B of the side frame and connected to the wiring cavity, so that the wiring of the infrared touch component FF in the top frame EE1 and the side frame can be connected to the second cavity E2A through the corner cavity E304.

Furthermore, the front surface of the lower corner piece can also be provided with a chamfer to match the shape of the front surface of the lower frame EE2 and the side frame, thereby improving the consistency of the frame assembly EE.

Optionally, at least one lower corner piece is provided with a wireless communication hole E303 to facilitate wireless communication between the wireless communication module in the second cavity E2A and the outside. For example, a WiFi module can be provided in the second cavity E2A, and the WiFi module can communicate with the outside through the wireless communication hole. Further, the wireless communication hole can be covered by a plastic sheet.

In some embodiments, the inner screw mounting hole HA on the first frame E1 is an oblong hole or a wall-mounting hole. In this way, the two adjacent second frames E2 on the same side of the display module MDL can be closely fitted to eliminate the splicing gap. The displacement of the second frame E2 in order to eliminate the splicing gap will not affect the aligning of the screw mounting hole HA and the frame connection hole HD.

In an embodiment of the present disclosure, the frame can be mounted by using the following method, to eliminate the gap between the frames.

Figure 10:
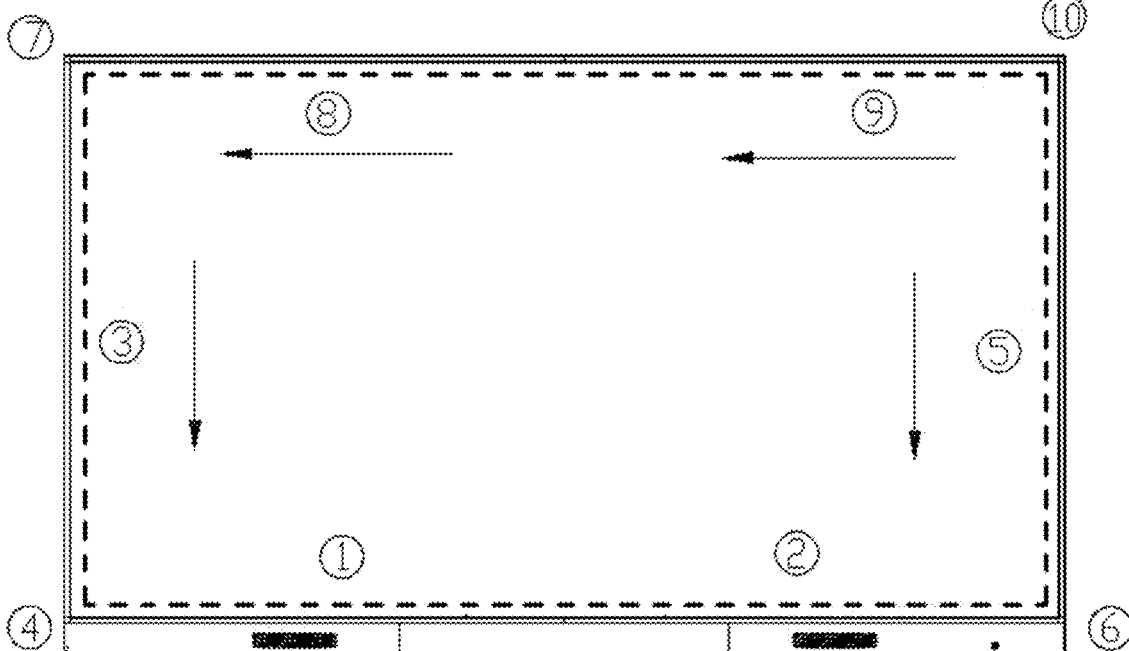
FIG. 10 is a schematic diagram of the assembly sequence of the frame assembly of the display device in an embodiment of the present disclosure.

First, refer to FIG. 9 and FIG. 10, based on the bottom side of the display module MDL, the lower frame EE2 is mounted first (that is, first perform the frames shown at ① and ② in FIG. 10). During the installation process, the display module MDL can be installed sequentially starting from the bottom center S of the display module MDL to both sides to finally form the lower frame EE2. During the installation of the lower frame EE2 or after the lower frame EE2 is completed, the infrared touch component FF can also be installed in the second frame E2, such as splicing the infrared emitter bar F2 or the infrared receiver bar F1.

Then, install the lower left corner piece E33 (action shown in ④ in FIG. 10), lower right corner piece E34 (action shown in ⑥ in FIG. 10), left frame EE3 (action shown in ③ in FIG. 10) and right frame EE4 (action shown in ⑤ in FIG. 10). On either side of the display module MDL, install the lower corner piece first, and then install the side frame. During the installation of the lower left corner piece E33, the lower right corner piece E34, the left frame EE3 and the right frame EE4, the splicing of the infrared touch component FF also needs to be completed. In this way, the infrared touch components FF in the left frame EE3 and the right frame EE4 form a horizontal touch unit, and whether the horizontal touch is successful can be tested. When installing the left frame EE3 and the right frame EE4, the first frame E1 can be installed sequentially from bottom to top, and the gap between the two adjacent first frames E1 can be eliminated during the installation process. When installing the lower corner piece, the lower corner piece (such as E33 shown in FIG. 13-2) and the lower frame EE2 can be connected by a screw DD4. Furthermore, the lower corner piece may also be provided with a pin hole DD5 aligned with the side frame. When the side frame is installed, the side frame and the pin hole DD5 of the lower corner piece are connected by a pin.

For example, in the first frame E1 for the right side, the inner screw mounting hole HA is a wall-mounting hole and the outer screw mounting hole HB is an oblong hole; wherein, the insertion hole of the wall-mounting hole is located at the end near the lower right corner piece E34. During installation, the screw can be pre-installed into the frame mounting holes on the right side of the display module MDL, with the gap between the end cap of the screw and the display module MDL no less than the thickness of first inner side wall E11 of the first frame E1. Then, align the insertion hole of the first frame E1 with the screw, insert the screw, and then pull down so that the first frame E1 is hanged on the right side of the display module MDL. Then, the position of the first frame E1 is adjusted so that the gap between adjacent first frames E1 is eliminated, thereby completing the position correction of the first frame E1. Then, tighten the screws through the outer screw mounting holes HB, thereby achieving fixation of the first frame E1. In this way, from bottom to top, the mounting, correction and fixation of each first frame E1 of the right frame EE4 are completed in sequence. The first frame E1 is mounted by the wall-hanging means, which can effectively reduce the difficulty of installation.

As another example, in the first frame E1 for the left side, the inner screw mounting hole HA is a wall-mounting hole and the outer screw mounting hole HB is an oblong hole; wherein, the insertion hole of the wall-mounting hole is located at the end near the lower left corner piece E33. During installation, the screw is pre-installed in the frame mounting holes on the left side of the display module MDL. The gap between the end cap of the screw and the display module MDL is not less than the thickness of the first inner side wall E11 of the first frame E1. Then, align the insertion hole of the first frame E1 with the screw, insert the screw, and then pull down so that the first frame E1 hangs on the left side of the display module MDL. Then, the position of the first frame E1 is adjusted so that the gap between adjacent first frames E1 is eliminated, thereby completing the position correction of the first frame E1. Then, tighten the screws through the outer screw mounting holes HB, thereby achieving fixation of the first frame E1. In this way, from bottom to top, the mounting, correction and fixation of each first frame E1 of the left frame EE3 are completed in sequence. The first frame E1 is mounted by the wall-hanging means, which can effectively reduce the difficulty of installation.

Then, one of the upper corner pieces can be installed (the action shown in ⑦ in FIG. 10) and the first frame E1 can be installed sequentially starting from the upper corner piece to form the top frame EE1 (the actions shown in ⑧ and ⑨ in FIG. 10). During the process of installing the upper corner piece and the first frame E1 of the top frame EE1, the upper corner piece and the first frame E1 are still corrected to eliminate the installation gap. Which upper corner piece should be installed first can be determined based on the position of the inner screw mounting hole HA on the first frame E1 of the top frame EE1. Specifically, in the present method, the upper corner piece at the side close to the inner screw mounting holes HA on the first frame E1 of the top frame EE1 may be mounted first.

For example, the inner screw mounting hole HA of the first frame E1 of the top frame EE1 is a wall-mounting hole and the outer screw mounting hole HB is an oblong hole. In the embodiment, the insertion hole of the wall-mounting hole is located at one end close to the upper left corner piece E31. During installation, the upper left corner piece E31 is first connected to the left frame EE3, and the installation gap is eliminated during the connection process. Then, each first frame E1 of the top frame EE1 is installed in sequence starting from the upper left corner piece E31, and the installation gap is eliminated during the installation process. When installing the first frame E1, the screw is first installed in the frame mounting holes on the top side of the display module MDL, and the gap between the end cap of the screw and the display module MDL is not less than the thickness of the first inner side wall E11 of the first frame E1. Then, align the insertion hole of the first frame E1 with the screw, insert the screw, and then pull it to the left so that the first frame E1 hangs on the top side of the display module MDL. Then, the position of the first frame E1 is adjusted so that the gap between adjacent first frames E1 is eliminated, thereby completing the position correction of the first frame E1. Then, tighten the screws through the outer screw mounting holes HB, thereby achieving fixation of the first frame E1. In this way, from left to right, the mounting, correction and fixation of each first frame E1 of the top frame EE1 are completed in sequence.

Figures 1, 2, 13:
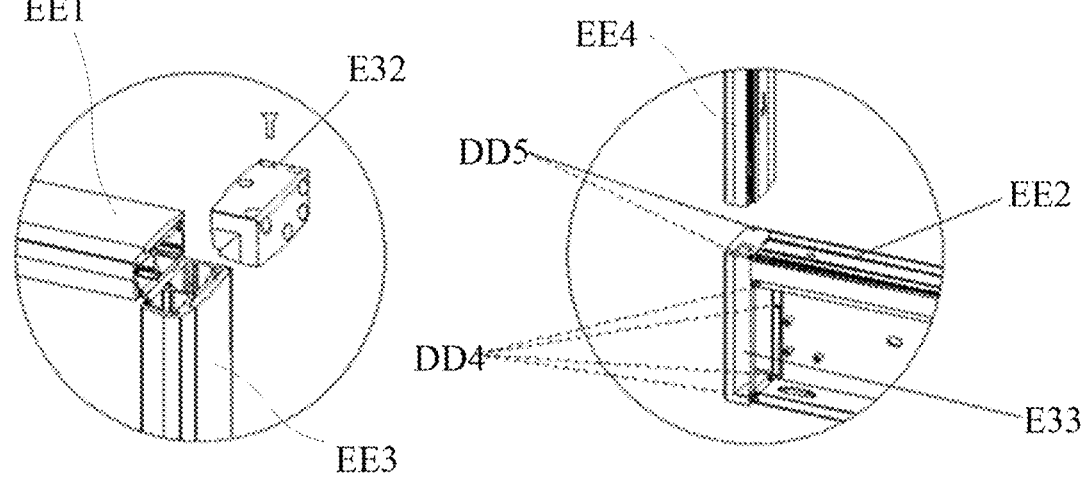

Finally, see FIG. 13-1, install the remaining upper corner pieces (action described in ⑩ in FIG. 10). In this way, various installation errors of the entire frame are accumulated to the last upper corner piece, and a correction can be achieved to ensure that there are no gaps in other parts of the frame.

Optionally, the display device may further include a base CC. After the display device chassis A121 is assembled, the backplane A2 of the display device chassis A121 can be connected to the base CC, so that the base CC supports the display device chassis A121. Then, the LED display panel A11 can be added to the display device chassis A121 to obtain the required display device. In this way, the display device of the present disclosure can be used in a wall-mounted state or in a base CC supported state.

Other embodiments of the disclosure will be readily apparent to those skilled in the art from consideration of the specification and practice of the invention disclosed herein. This application is intended to cover any variations, uses, or adaptations of the disclosure that follow the general principles of the disclosure and include common knowledge or customary technical means in the technical field that are not disclosed in the disclosure. It is intended that the specification and examples be considered as exemplary only, with a true scope and spirit of the disclosure being indicated by the following claims.

What is claimed is:

1. A display device, comprising:
a display module, and
a frame assembly surrounding the display module; wherein the frame assembly comprises a plurality of first frames disposed on an upper side and each lateral side of the display module and a second frame disposed on a lower side of the display module;
the first frame comprises a first inner side wall, a first outer side wall and a connecting side wall, the first outer side wall is away from the display module relative to the first inner side wall, the connecting side wall is disposed between the first inner side wall and the first outer side wall and comprises a first connecting side wall and a second connecting side wall disposed in front of the first connecting side wall, and wherein a first cavity is formed by the first connecting side wall, the second connecting side wall, the first inner side wall and the first outer side wall; and
the first inner side wall and the display module are connected by a screw with an end cap located in the first cavity.

2. The display device according to claim 1, wherein the first inner side wall and the first outer side wall are respectively formed with an inner screw mounting hole and an outer screw mounting hole aligned with each other; the screw is connected to the display module through the inner screw mounting hole, and the outer screw mounting hole is configured to facilitate using of installation tools when tightening the screw.

3. The display device according to claim 2, wherein the inner screw mounting hole is extended along an extending direction of the first frame and comprises a penetration hole at one end and a long hole connected to the penetration hole; the penetration hole is configured to allow the end cap of the screw to pass through; and the long hole is configured to allow a screw rod of the screw to pass through but does not allow the end cap of the screw to pass through.

4. The display device according to claim 3, wherein the frame assembly comprises a top frame disposed on the upper side of the display module and a side frame disposed on each lateral side of the frame assembly;
the side frame comprises one or more first frames, and the penetration hole in the first frame is located below the long hole; and
the top frame comprises one or more first frames, and in each inner screw mounting hole in the first frame, the penetration hole is located on a same side of the long hole.

5. The display device according to claim 2, wherein the first frame further comprises a frame cover, the frame cover is detachably connected to the first outer side wall and is covered on the outer screw mounting hole.

6. The display device according to claim 5, wherein when a plurality of first frames are spliced sequentially along a straight line, the frame covers of the plurality of first frames spliced sequentially along the straight line have an integrated structure.

7. The display device according to claim 5, wherein a slide groove extending along an extending direction of the first frame is disposed on an outer surface of the first outer side wall, and the frame cover comprises a slide bar that is in sliding fit with the slide groove.

8. The display device according to claim 1, wherein the first inner side wall and the first outer side wall are extended beyond the display module in a front direction;

the connecting side wall further comprises a third connecting side wall, and the third connecting side wall is connected to a front end of the first outer side wall; and a first infrared cavity for accommodating an infrared touch component is encircled by the first inner side wall, the first outer side wall, the second connecting side wall and the third connecting side wall; and a first light-transmitting slit communicating with the first infrared cavity is formed between the first inner side wall and the third connecting side wall, and the first light-transmitting slit is disposed in front of the display module.

9. The display device according to claim 1, wherein the frame assembly comprises a top frame disposed on the upper side of the display module and a side frame disposed on each lateral side of the frame assembly; the side frame comprises one first frame or a plurality of first frames that are spliced in sequence; the top frame comprises a plurality of first frames that are spliced in sequence; a pin hole is provided at each end of the first frame, and two adjacent first frames spliced along a straight line are connected through a pin inserted into the pin hole.

10. The display device according to claim 9, wherein the pin comprises a threaded section and a pin rod section; and the pin hole at one end of the first frame is a first pin hole that is able to be in screw thread fit with the threaded section, and the pin hole at other end of the first frame is a second pin hole that is able to be in interference fit with the pin rod section.

11. The display device according to claim 9, wherein a protruding portion is disposed in the first cavity, and the pin hole is formed in the protruding portion; the protruding portion further comprises an opening slit communicating with the pin hole and extended along an extension direction of the first frame.

12. The display device according to claim 10, wherein in the side frame, the pin hole at a lower end of the first frame is the first pin hole, and the pin hole at an upper end of the first frame is the second pin hole; and in the top frame, the first pin hole of each first frame is located at a same end of the first frame.

13. The display device according to claim 1, wherein the second frame comprises a second cavity and a detachable front cover, and a system control component for driving the display module is disposed in the second cavity.

14. The display device according to claim 13, wherein the second frame comprises a second inner side wall, a second outer side wall and a rear side wall; the second outer side wall is away from the display module relative to the second inner side wall; the rear side wall is connected with a rear side end of the second inner wall and a rear side end of the second outer wall; and a second cavity is encircled by the second inner wall, the second outer wall, the rear side wall and the front cover; and the second inner side wall and the display module are connected by a screw with an end cap located in the second cavity.

15. The display device according to claim 14, wherein the second inner wall is extended beyond the display module in a front direction; the second frame further comprises a first vertical wall, a second vertical wall and a horizontal wall; the first vertical wall is connected to a lower side of the second inner wall; the horizontal wall is connected to a lower end of the first vertical wall and a lower end of the second vertical wall;

a second infrared cavity for accommodating an infrared touch component is encircled by the first vertical wall, the second vertical wall, the horizontal wall and the second inner wall; and a second light-transmitting slit communicating with the second infrared cavity is formed between the second inner wall and the second vertical wall, and the second light-transmitting slit is disposed in front of the display module.

16. The display device according to claim 15, wherein the horizontal wall comprises an inserting plate extending downward; and an upper end of the front cover comprises a slot that matches the inserting plate; and a lower end of the front cover is detachably connected to the second outer side wall.

17. The display device according to claim 16, wherein the front cover comprises a cover portion and a connecting portion, an upper end of the cover portion comprises the slot; a lower end of the cover portion is connected to an upper end of the connecting portion by a screw; and a lower end of the connecting portion is bent below the second outer side wall and connected to the second outer side wall by a screw.

18. The display device according to claim 1, wherein the frame assembly further comprises a corner piece disposed at four top corners; and the corner piece is connected to the first frame or the second frame.

19. The display device according to claim 18, wherein the corner piece comprises a lower corner piece disposed at a lower top corner and an upper corner piece disposed at an upper top corner; the frame assembly comprises a top frame disposed at the upper side of the display module, a bottom frame disposed at the lower side of the display module and a side frame disposed at each lateral side of the display module;

the lower corner piece and the bottom frame are connected by a screw; the side frames are connected with the upper corner piece and the lower corner piece by a pin; and the pin comprises a threaded section and a pin rod section; and wherein the lower corner piece is in screw thread fit with the threaded section of the pin, a lower end of the side frame is in interference fit with the pin rod section of the pin; an upper end of the side frame is in screw thread fit with the threaded section of the pin, and the upper corner piece is connected to the pin rod section of the pin.

20. The display device according to claim 1, wherein the display module comprises a plurality of interconnected connection structures and a plurality of LED display panels located on each of the connection structures; and the connection structure comprises a frame connection hole capable of connecting with the frame assembly by the screw.

* * * * *